United States Patent [19]

Grabbe

[11] 4,426,769

[45] Jan. 24, 1984

[54] MOISTURE GETTER FOR INTEGRATED CIRCUIT PACKAGES

[75] Inventor: Dimitry G. Grabbe, Lisbon Falls, Me.

[73] Assignee: AMP Incorporated, Harrisburg, Pa.

[21] Appl. No.: 292,989

[22] Filed: Aug. 14, 1981

[51] Int. Cl.³ .............................................. H01L 21/56
[52] U.S. Cl. .................................... 29/588; 29/577 C; 357/78
[58] Field of Search ................. 29/588, 589, 577 C; 357/78; 252/181.1; 156/DIG. 66

[56] References Cited

U.S. PATENT DOCUMENTS

| | | | |
|---|---|---|---|
| 2,928,030 | 3/1960 | Lighty | 357/78 |
| 3,083,320 | 3/1963 | Godfrey et al. | 357/78 |
| 3,487,275 | 12/1969 | Perrin et al. | 357/78 |
| 3,615,913 | 10/1971 | Shaw | 427/82 X |
| 3,714,709 | 2/1973 | Liederbach | 29/589 X |
| 4,238,528 | 12/1980 | Angelo et al. | 29/588 X |
| 4,360,444 | 11/1982 | Esterl et al. | 252/181.1 |

Primary Examiner—George Ozaki
Assistant Examiner—David A. Hey

[57] ABSTRACT

A moisture getter, which is a material capable of absorbing moisture, is painted within the cap of an integrated circuit package prior to sealing. The package is then heated to the high sealing temperature necessary to provide sealing without affecting the getter material. The getter material is formed from a family of materials which is capable of withstanding the high temperature of the sealing process without degradation and which can absorb a large amount of water after exposure to sealing temperatures.

1 Claim, 2 Drawing Figures

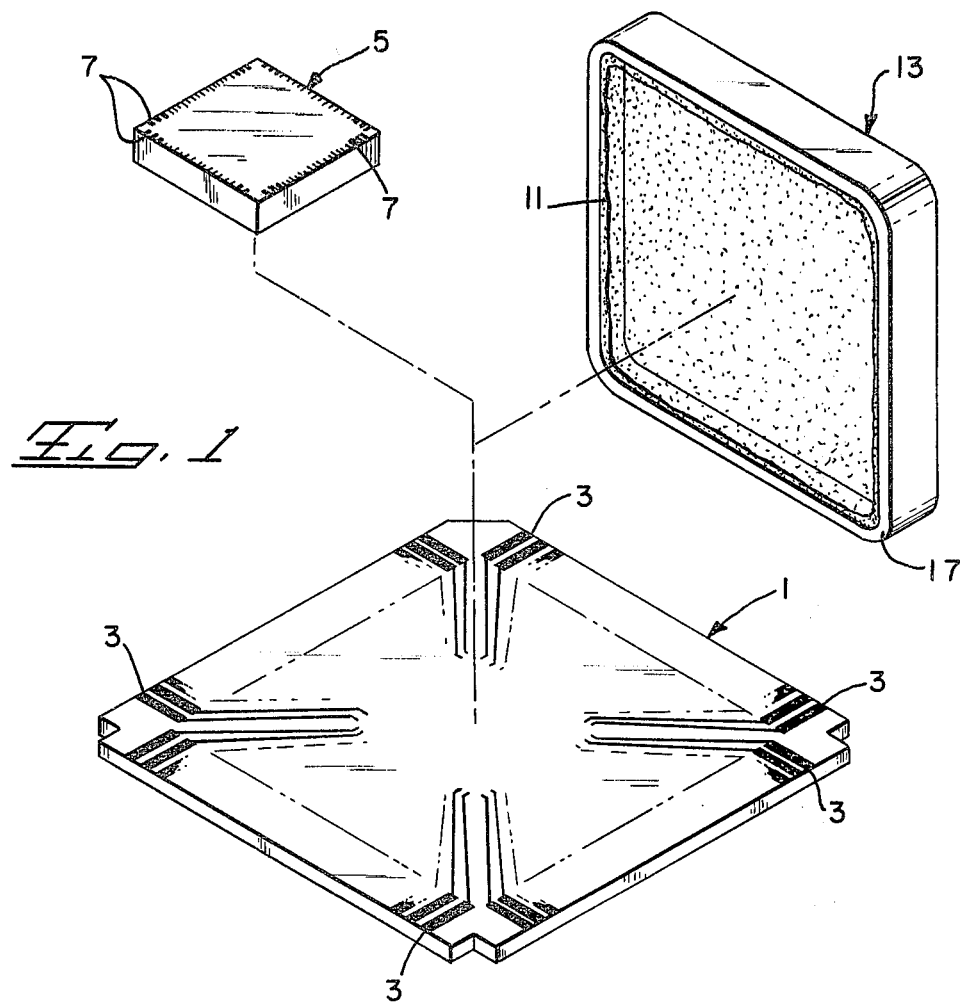
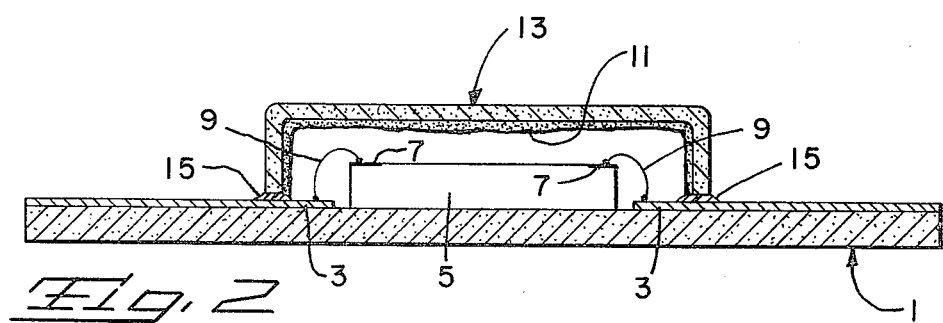

MOISTURE GETTER FOR INTEGRATED CIRCUIT PACKAGES

BACKGROUND OF THE INVENTION

1. Field of the Invention

This invention relates to an integrated circuit package and, more particularly, to a moisture getter material provided within the sealed package which is capable of withstanding the high sealing temperatures required in package formation without degradation of the getter properties of the material.

2. Description of the Prior Art

The problem of moisture in hermetically sealed integrated circuit packages has not been uniformly recognized in the prior art and, in any event, has not been adequately handled.

In the formation of an hermetically sealed semiconductor device or chip package, it is necessary to exclude moisture from the sealed cavity. This is because the device is mounted in such a manner that, after reaching a high temperature, turning off and cooling, the substrate which carries the device cools down first. The substrate is designed to carry the heat away most efficiently. The result is that the surrounding medium and the device will have a temperature differential, the device being the colder. Any moisture present in the cavity will therefore condense on the surface of the device and leads thereto, such moisture being then available as a liquid electrolyte to transport ions and promote corrosion. Therefore, it is desirable to eliminate the moisture from the package. The origin of the moisture is multifold. First, the atmosphere in the sealing furnace has some; second, some of the glasses themselves as a result of fusion liberate water; and third, the ceramic material which has some porosity has moisture in it which goes into the micro-cracks therein and by osmotic pressure is extremely difficult to remove.

One problem in the use of standard getters to remove moisture is that they do not adequately retain their getter properties after being heated to the temperatures required to hermetically seal the package.

SUMMARY OF THE INVENTION

In accordance with the present invention, there is provided a moisture getter, which is a material capable of absorbing moisture and having the required properties which is deposited within the cap of an integrated circuit package prior to sealing. The package is then heated to the high sealing temperature necessary to provide sealing without affecting the getter material.

The surfaces of the cavity other than the metal conductors are used for applying a getter which could be provided from a family of organic materials like polyimids which would withstand very high temperatures, i.e. 500° C., have a microporosity, and be able to support as much as 3% by weight of water in a saturated condition. This material is coated inside the ceramic cap and the ceramic is then baked out at a high temperature of about 500° C. Sealing is accomplished at such high temperature and, because of this bake out, the polyimid is dry and has micropores available in which the moisture condenses preferentially, as it is being liberated from the glass and elsewhere, and gradually all of the moisture will sit inside the polyimide. Because the osmotic pressure of the micropores in the polyimid is very high, the moisture will not come out, and the result is that the chamber is free from any moisture and it will prevent or reduce corrosion failure. Materials that can be used as the getter are polyimids, polyamids, crosspolymers of polyamids and polyimids and some enamels which form micro-cracks.

BRIEF DESCRIPTION OF THE DRAWINGS

FIG. 1 is an exploded view of an enlarged circuit package in accordance with the present invention.

FIG. 2 is a cross-sectional view of the circuit of FIG. 1 in assembled condition.

DETAILED DESCRIPTION OF THE PREFERRED EMBODIMENT

Referring now to the figures, there is shown a ceramic chip carrier 1 having appropriate leads and pads 3 thereon in accordance with the prior art. A semiconductor chip 5 is positioned at the center of the chip carrier 1 as shown in FIG. 2 and is bonded thereto in standard manner. Pads 7 on the chip 5 are connected to leads on the chip carrier by means of wires 9 in well-known manner. A moisture getter is painted on the inside surface of the cap structure 13 prior to formation of the package. The cap 13 is sealed to the chip carrier by means of a sealant 15 (FIG. 2) at elevated temperatures.

The package is assembled by initially painting or otherwise depositing or coating the getter material 11, which is a material which does not lose its getter properties at the high sealing temperature required, such as polyimids and the like. The chip 5 is bonded to the chip carrier 1 and appropriate wire connections 9 are made from pads 7 on the chip to leads 3 on the chip carrier. The sealant 15 is then placed around the bottom surface 17 of the cap structure 13 and the entire unit is assembled and fired to a temperature whereby the sealant 15 bonds to the cap 13 and the structure 1 to provide a hermetic seal and hermetically seal the interior of the cap from the outside environment. The getter material 11 will withstand these temperatures to the extent that the getter properties will not be materially affected. In this manner, moisture will be prevented from condensing onto the leads 3 and wire 9 and the semiconductor surface within the package and thereby cause corrosion and degradation of the circuit.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of forming an hermetically sealed integrated circuit package comprising the steps of:
   (a) providing a substrate having a lead structure thereon,
   (b) assembling a semiconductor chip onto said substrate,
   (c) making appropriate interconnection between said chip and said substrate,
   (d) providing a cap having a polyimide getter material therein capable of retaining its getter properties after exposure to sealing temperatures,
   (e) placing said cap on said substrate enclosing said chip,
   (f) placing a sealant between said cap and said substrate, and
   (g) heating said cap, sealant and substrate to hermetically seal said cap to said substrate.

* * * * *